United States Patent
Rottstegge et al.

(10) Patent No.: US 7,018,784 B2
(45) Date of Patent: *Mar. 28, 2006

(54) PROCESS FOR INCREASING THE ETCH RESISTANCE AND FOR REDUCING THE HOLE AND TRENCH WIDTH OF A PHOTORESIST STRUCTURE USING SOLVENT SYSTEMS OF LOW POLARITY

(75) Inventors: Jörg Rottstegge, Lilienthal (DE);
Waltraud Herbst, Uttenreuth (DE);
Gertrud Falk, Erlangen (DE);
Eberhard Kühn, Hemhofen (DE)

(73) Assignee: Infineon Technologies AG, Munich (DE)

( * ) Notice: Subject to any disclaimer, the term of this patent is extended or adjusted under 35 U.S.C. 154(b) by 206 days.

This patent is subject to a terminal disclaimer.

(21) Appl. No.: 10/375,532

(22) Filed: Feb. 27, 2003

(65) Prior Publication Data
US 2004/0043330 A1    Mar. 4, 2004

(30) Foreign Application Priority Data
Feb. 27, 2002  (DE)  ................................ 102 08 449

(51) Int. Cl.
*G03F 7/00*    (2006.01)

(52) U.S. Cl. ...................... 430/322; 430/325; 430/330; 430/331; 430/401; 430/414; 430/432

(58) Field of Classification Search ................ 430/322, 430/325, 330, 331, 401, 414, 432

See application file for complete search history.

(56) References Cited

U.S. PATENT DOCUMENTS

| 4,628,018 A | * | 12/1986 | Lin et al. ................... 430/58.8 |
| 4,756,989 A | * | 7/1988 | Ai et al. .................. 430/272.1 |
| 5,234,793 A | * | 8/1993 | Sebald et al. ............... 430/323 |

(Continued)

FOREIGN PATENT DOCUMENTS

| DE | 101 31 144 A1 | 4/2003 |
| DE | 101 53 497 A1 | 6/2003 |

(Continued)

OTHER PUBLICATIONS

John Simmons et al.: "Image Collapse Issues in Photoresist", *Proceedings of SPIE*, vol. 4345, 2001, pp. 19-29.

(Continued)

*Primary Examiner*—Nicole Barreca
(74) *Attorney, Agent, or Firm*—Laurence A. Greenberg; Werner H. Stemer; Ralph E. Locher

(57) ABSTRACT

The invention relates to a process for amplifying structured resists. The process permits a subsequent increase in the etch resistance and a change in the structure size of the resist even in the case of ultrathin layers. The chemical amplification is carried out in a solvent that is so nonpolar that it does not dissolve the structured resist or dissolves it only to an insignificant extent. Because of the lower surface tension of these solvents, the danger of a collapse of these structures is additionally avoided.

19 Claims, 2 Drawing Sheets

U.S. PATENT DOCUMENTS

| | | | |
|---|---|---|---|
| 5,234,794 A | 8/1993 | Sebald et al. | 430/325 |
| 5,250,375 A | 10/1993 | Sebald et al. | 430/8 |
| 5,300,404 A | 4/1994 | Tani et al. | 430/326 |
| 6,251,558 B1 | 6/2001 | Elian et al. | 430/270.1 |
| 6,686,131 B1* | 2/2004 | Elian | 430/322 |
| 6,759,184 B1* | 7/2004 | Rottstegge et al. | 430/322 |
| 2003/0124468 A1* | 7/2003 | Ferbitz et al. | 430/325 |

FOREIGN PATENT DOCUMENTS

| | | |
|---|---|---|
| EP | 0 395 917 A2 | 11/1990 |
| EP | 0 395 917 B1 | 11/1990 |
| EP | 0 492 253 A1 | 7/1992 |
| EP | 0 874 281 A1 | 10/1998 |
| EP | 0 955 562 A1 | 11/1999 |
| EP | 1 045 289 A2 | 10/2000 |

OTHER PUBLICATIONS

J.M.G. Barthel et al.: "Physical Chemistry of Electrolyte Solutions: Modern Aspects", *Dr. Dietrich Steinkopff Verlag GmbH & Co KG, Darmstadt, 1998*, pp. 1-3.

\* cited by examiner

FIG. 1A
FIG. 1B
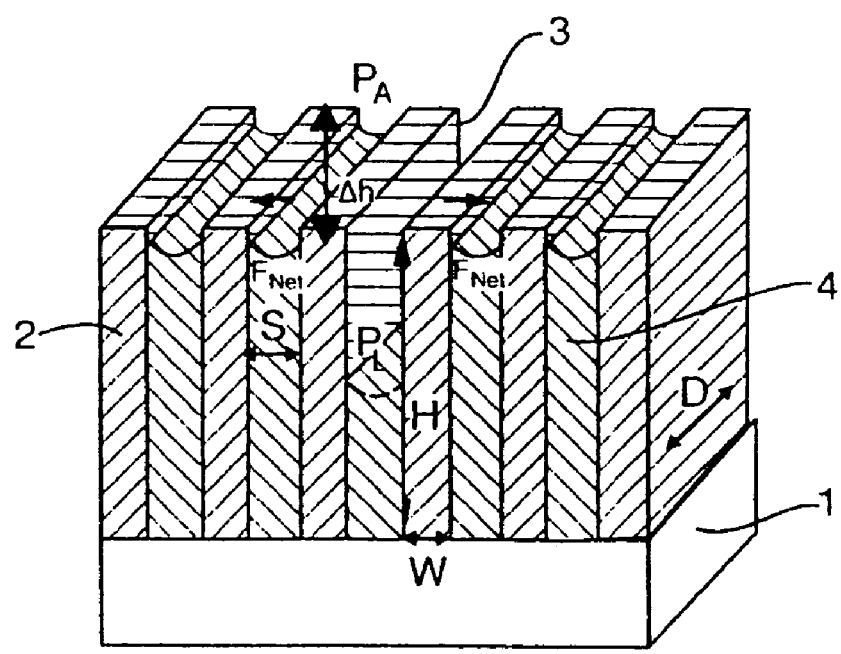
FIG. 2

PROCESS FOR INCREASING THE ETCH RESISTANCE AND FOR REDUCING THE HOLE AND TRENCH WIDTH OF A PHOTORESIST STRUCTURE USING SOLVENT SYSTEMS OF LOW POLARITY

BACKGROUND OF THE INVENTION

Field of the Invention

The invention relates to a process for chemically amplifying structured resists.

In producing microchips, thin layers of photoresists are used for structuring semiconductor substrates. The chemical nature of the photoresists can be selectively changed by exposure using a photomask or by direct exposure, for example, by an electron beam. After a development step in which either the exposed or the unexposed parts of the photoresist are removed, a structured photoresist is obtained and is used as a mask, for example, for etching the semiconductor substrate. A plasma in which material is removed by particles which contain high energy is generally used for etching. In order to be able selectively to etch only the bare parts of the substrate, the photoresist must have sufficient resistance to the etching plasma.

The action of an etching plasma can be divided approximately into a physical and a chemical part. The physical part results in virtually material-independent removal of material. The components of the plasma strike the substrate surface and knock out particles there. To achieve a differentiation between sections covered by the resist mask and uncovered sections, the resist mask must have a certain layer thickness so that a sufficient layer thickness of the resist is still present on the covered sections at the end of the etching process to protect those sections of the substrate surface which lie underneath.

The chemical part of the etching process is based on a different reactivity of the plasma with respect to different materials. Thus, in an oxygen plasma, organic materials are converted into gaseous compounds so that rapid removal of material takes place, whereas organosilicon compounds are converted into silicon dioxide, which remains as a solid on the substrate surface and is removed only by the physical part of the etching action.

Thus, two possibilities are available for increasing the etch resistance of the resist layer.

The first possibility for improving the etch resistance consists in increasing the layer thickness of the photoresist.

However, an increase in the layer thickness is subject to limits since the transparency of the resist decreases with increasing layer thickness, with the result that the deeper parts close to the substrate are under certain circumstances only insufficiently exposed. This results in only incomplete chemical modification of the photoresist in the deeper parts, and resist residues which form so-called resist feet remain in the trenches after the development of the exposed photoresist. Error-free transfer of the structure defined by the photomask is no longer possible.

These difficulties occur in particular during exposure of the photoresist to short-wave radiation, for example at a wavelength of 157 nm, since the materials used to date have only low transparency at these wavelengths. The transparency of the resist is influenced primarily by the polymer which is contained in the resist. The best polymers currently used in photoresists achieve an absorption coefficient of about $\mu_{10}=1/\mu m$ at a wavelength of 157 nm. These polymers thus still have about 50 times higher absorption at an exposure wavelength of 157 nm compared with polymers which are used for exposures to radiation having a wavelength of 193 nm or 248 nm. Since in particular the commercially available 193 and 248 nm resists have several times this absorption, it has been possible to date to realize only very thin resist layers having layer thicknesses of not more than 50 nm.

Even in the case of thin layers, the absorption of the resists is still so high that only about 40% of the original light intensity reaches the lowermost resist layer in a resist as thin as 50 nm. Sufficient etch resistance, which is required for error-free transfer of a structure to a substrate arranged below the resist, is therefore generally not ensured.

A second possibility for improving the etch resistance is the incorporation of silicon-containing groups into the polymer of the photoresist. The silicon is then converted in the oxygen plasma into a silicon dioxide layer which covers the substrate. The silicon-containing groups can be introduced into the polymer by copolymerization of corresponding silicon-containing comonomers. A suitable comonomer is, for example, allyltrimethylsilane. The silicon-containing groups are therefore bonded as side groups to the main chain of the polymer. If radiation having a very short wavelength, for example a wavelength of less than 200 nm, is used for the exposure, the carbon-silicon bond can be broken by the energy of the radiation. Low molecular weight silicon-containing compounds can be formed and escape from the resist and are converted by residual oxygen or moisture, which is present in the gas phase above the photoresist, into silicon dioxide. The silicon dioxide deposited on the optical systems of the exposure unit damages the systems. In general, no silicon-containing groups are therefore provided in polymers for photoresists which are suitable for very short wavelengths.

A chemical amplification process that subsequently changes the dimensions of structures in the photoresist and their etch resistance has already been developed for the resists used to date for wavelengths of, for example, 248 nm or 193 nm. This process makes it possible to produce structures whose dimensions are below the limit of resolution of the exposure optical system.

After structuring, i.e. after exposure and development of the photoresist, the photoresist is chemically amplified using an amplification agent. For this purpose, the polymer contained in the photoresist includes anchor groups which can react with a suitable reactive group of an amplification agent in order to bind the amplification reagent to the polymer. The layer thickness of the photoresist can be subsequently increased by incorporating further groups. If the resist structures have a sufficient layer thickness, narrowing the trenches by laterally growing layers on the sidewalls of the trenches of the structured resist can also be effected. This permits an improvement in the resolution, for example, formation of narrower conductor tracks. Simultaneously with the lateral growth, the layer thickness also increases perpendicular to the substrate surface.

For the chemical amplification of the photoresist, the anchor groups must have sufficient reactivity to undergo a reaction with the reactive group of the amplification agent within a short reaction time and to bind the agent via a preferably covalent bond to the polymer.

Such a subsequent chemical amplification of photoresists is possible, for example, by the CARL process (CARL=Chemical Amplification of Resist Lines) described in Published European Patent Application EP 0 395 917 B1. For this purpose, for example, maleic anhydride is incorporated as a comonomer into the polymer of the photoresist.

The carboxylic anhydride group then serves as an anchor group that can be nucleophilically attacked, for example, by an amino group of the amplification agent. The amplification agent may be applied as a solution in a suitable solvent, generally an alcohol, or from the gas phase to the structured resist and is then bound to the polymer of the photoresist via an amide bond.

In this way, organosilicon compounds can also be incorporated subsequently into the resist structures. This incorporation reaction is often referred to as silylation. In addition to silicon-containing groups, it is also possible to introduce aromatic or polycyclic aliphatic groups into the polymer, in order to increase the etch resistance. The introduction of aromatic groups is generally referred to as aromatization.

However, the process for chemical amplification, disclosed in Published European Patent Application EP 0 395 917 B1, cannot be applied directly to ultrathin layers, as used, for example, in photoresists for an exposure wavelength of 157 nm.

During the chemical amplification, the resist layer is initially swollen or, at the edges of the structures, even partially dissolved by the solvent of the amplification agent. This makes it possible for the amplification agent also to penetrate into deeper layers of the photoresist and to react there with the anchor groups of the polymer. As a result of the reaction between the amplification agent and the anchor groups, crosslinking of the polymer by the amplification agent takes place. Consequently, the solubility of the polymer in the solvent of the amplification agent also decreases. If the swelling or the dissolution of the resist layers predominates at the beginning of the chemical amplification, the surface of the resist layer is increasingly crosslinked in the further course by the reaction of the amplification agent with the polymer, and the dissolution of the resist layer slows down. As a result of the further incorporation of amplification agent, the increase in layer thickness finally predominates over further dissolution of the resist layer. The volume of the resist structure then increases. The loss of layer thickness may be 20 nm or more in the first 25 seconds of the chemical amplification. Only after this period, i.e. after sufficient crosslinking of the resist layer by the amplification agent, does the increase in layer thickness predominate over the removal of the layer by the solvent.

The processes known to date for chemical amplification have been optimized for high reaction rates and anhydride-containing polymers having a high content of free carboxylic acids and for dissolution and washing media of medium polarity, such as, for example, low molecular weight alcohols. It has been observed that, in particular, partly exposed parts, i.e. the edge regions of the structures, dissolve during the chemical amplification and a final wash step in which excess amplification agent is removed. Partly exposed parts form at the boundary between exposed and unexposed parts. The chains of the polymer can be arranged in the photoresist in such a way that they stretch across the boundary between exposed and unexposed parts. During the exposure, chemical modification therefore takes place only in a segment of the polymer. If the proportion of the chemically modified segment falls below a specific value, the polymer is no longer removed during the development, but remains on the sidewalls of the resist structure. The sidewalls of a resist structure therefore generally have a chemical structure that differs from that of the top of the sidewall, which was not exposed.

If an attempt is made to apply the CARL process to ultrathin resist layers having a thickness of about 50 nm and to fine resist structures having widths of less than 100 nm, the layers or structures are dissolved away before the inhibition of the surface begins. A growth in layer thickness or a broadening of the structures can no longer take place since now insufficient material is available in the resist layer/resist structure. In the case of ultrathin layers and ultrafine structures, the inhibition is generally so small that the thin resist layers dissolve completely. The subsequent increase in the thickness of ultrathin layers therefore appears impossible.

A further difficulty occurs in the development or the chemical amplification of structures having a very high aspect ratio. An aspect ratio is understood as meaning the ratio of the height of a structure, i.e. the thickness of the resist layer, to its width. In the case of narrow and high lines having an aspect ratio of more than 3:1, long resist lines collapse during the development of the exposed and contrasted resist. The collapse of the structures is caused by forces acting on the structures during the processing. After the development or washing, the trenches between the structures are initially filled with a liquid, in general water. The water evaporates gradually, and capillary forces act on the structure and can lead to its collapse. J. Simons et al., Image Collapse Issues in Photoresist, Proc. SPIE 4345, 2001, 19–29, describe various attempts to solve the problem of a collapse of structures, in particular in the case of development in an aqueous medium. The surface tension of water is relatively high ($\gamma=72.8$ mN/m). By adding surfactants, it is possible substantially to reduce the surface tension and hence the danger of a collapse of the structures. A similar phenomenon is also to be observed in chemical amplification. During the chemical amplification, the structures swell with increasing reaction time because the solvent in which the amplification agent is dissolved diffuses in. The amplified structures are thus initially very soft. On washing and subsequent drying of the amplified structures, they then tend likewise to collapse on drying.

SUMMARY OF THE INVENTION

It is accordingly an object of the invention to provide a process for chemically amplifying structured resists, which overcomes the above-mentioned disadvantages of the prior art methods of this general type.

In particular, it is an object of the invention to provide a process for chemically amplifying structured resists, which permits a subsequent increase in the layer thickness even in the case of ultrathin resist layers and in the case of structures having a high aspect ratio.

With the foregoing and other objects in view there is provided, in accordance with the invention, a process for chemically amplifying structured resists, including the following steps:

(a) applying a chemically amplified photoresist to a substrate, the photoresist containing the following components:
  a film-forming polymer which includes acid-labile groups that are cleaved under the action of acid and liberate groups which results in an increase in the solubility of the film-forming polymer in aqueous alkaline developers, and which furthermore includes anchor groups for the linkage of amplification agents, it also being possible for the anchor groups to be present in the form of a protected anchor group,
  a photo acid generator, and
  a first solvent in which the film-forming polymer is soluble; and (b) drying the photoresist to obtain a resist film;

(c) section-by-section exposing the resist film so that an exposed resist is obtained, an acid being liberated in the exposed parts by the photo acid generator;

(d) heating the exposed resist, the acid-labile groups being cleaved in the exposed parts and polar groups being liberated on the film-forming polymer, with the result that nonpolar resist sections and polar resist sections are obtained;

(e) developing the resist with an aqueous alkaline developer that has a higher polarity than the first solvent and in which the film-forming polymer is insoluble, the polar resist sections being detached from the substrate and a structured resist being obtained;

(f) optionally liberating the anchor groups from the protected anchor groups;

(g) applying an amplification agent dissolved in a second solvent to the structured resist, the second solvent having a lower polarity than the first solvent and the film-forming polymer being substantially insoluble in the second solvent, and the amplification agent having at least one reactive group that can react with the anchor group of the film-forming polymer so that the amplification agent is linked to the film-forming polymer; and (h) removing the excess amplification agent by using a third solvent which has a lower polarity than the first solvent and in which the film-forming polymer is insoluble.

In contrast to the CARL process described above, in the inventive process, the chemical amplification and the final washing step are carried out in a nonpolar solvent. The solvent in which the chemical amplification is carried out, in this case referred to as the second solvent, is chosen so that it does not dissolve the film-forming polymer. It is not necessary for the film-forming polymer to be completely insoluble in the second solvent. The film-forming polymer may also have a very low solubility in the second solvent, so that the film-forming polymer is swollen, but not dissolved, in the second solvent. Because of the small layer thicknesses that are available at the beginning of the chemical amplification, the polarity of the second solvent can be varied only within narrow limits, since otherwise predominant or complete detachment of the resist structures from the substrate surface occurs. If the first solvent, in which the film-forming polymer for the production of the photoresist must be soluble, is taken as a reference point, the second solvent must be nonpolar. Whether the nonpolar solvent is suitable for carrying out the inventive process can be checked, for example, by a simple reprecipitation experiment. For this purpose, the film-forming polymer is first dissolved in the first solvent, a relatively highly concentrated solution being preferred. If the second solvent is now added, the film-forming polymer must be precipitated again. The reprecipitation experiment can also be carried out in such a way that a solution of the film-forming polymer in the second solvent is added dropwise while observing whether a precipitate is formed.

When carrying out the inventive process, the procedure adopted is essentially similar to that in the CARL process described above. However, the use of a solvent that has a low polarity so that the resist film is no longer dissolved is important for the chemical amplification and the subsequent washing. It is therefore now also possible to use ultrathin resist films as photomasks and to subsequently modify their layer thickness or their etching properties. In the case of thicker resist layers or in the case of structures having a high aspect ratio, a collapse of the structures can be avoided. Because of the lower polarity of the solvents used, the structures do not swell to such a great extent. Furthermore, the nonpolar solvents used have a lower surface tension than the alcohols generally used to date as solvents in the CARL process. On evaporation of the solvents after washing, considerably smaller capillary forces therefore act on the resist structures, so that the amplified resist structures are no longer destroyed.

The term polarity as used for the inventive process can be described by using a comparative relationship.

Assuming that the film-forming polymer is of medium polarity, i.e. there is in each case at least one polymer system of lower or higher polarity, then, in the context of the invention, a second or third solvent is more nonpolar or more polar than the first solvent if the film-forming polymer is soluble in the first solvent but insoluble or at least substantially insoluble in the second or third solvent. The insolubility of the polymer in the second or third solvent can be checked by reprecipitation of the film-forming polymer in the second or third solvent. A third solvent is, for example, a solvent which is used for washing the resist polymer.

The distinction between the polarity properties of nonpolar and polar solvents can be made, for example, using water as a reference system. The solvent with better solubility properties in water is defined as the more polar solvent and the other as the more nonpolar one.

For the production of the photoresist used in the inventive process, it is possible in principle to use all customary polymers that are used in photoresists and have, in the polymer chain or as side groups, acid-labile groups that have low alkali solubility, and by catalytic action of acid and optionally a simultaneous thermal treatment (contrasting), produce polar groups, for example, acidic groups, on the polymer. Examples of suitable acid-labile groups are: tert-alkyl ester, tert-butoxycarbonyloxy, tetrahydrofuranyl, tetrahydro-pyranyl, tert-butyl ether, lactone or acetal groups. Tert-Butyl ester groups are particularly preferred. Carboxyl groups or, preferably acidic, hydroxyl groups, by means of which the polarity of the polymer increases and hence its solubility in the polar, preferably alkaline developers, are liberated from these acid-labile groups under the catalytic action of acid. Such polymers are described, for example, in the abovementioned Published European Patent Application EP 0 395 917.

The inventive process is particularly suitable for chemically amplifying ultrathin layers, as used, for example, in an exposure to a very short-wave radiation, in particular a radiation having a wavelength of 157 nm. Polymers for such photoresists generally have a very high degree of fluorination. The polymer therefore preferably includes repeating units that result in an increased transparency of the polymer (and hence of the resist layer) to light of very short wavelengths, for example 157 nm, such as, for example, 1,1,1,3,3,3-hexafluoro-2-hydroxyisopropyl groups in which the hydroxyl groups are protected by a tert-butyl ether, tert-butoxycarbonyloxy, tetrahydrofuranyl, tetrahydropyranyl or acetal radical or another acid-cleavable radical.

The film-forming polymer can be obtained by polymerization or copolymerization of corresponding monomers which include acid-labile groups. Suitable monomers are, for example, acrylates, methacrylates, maleic mono- and diesters, itaconic mono- and diesters, norbornenecarboxylic esters or norbornenedicarboxylic mono- and diesters. The ester group forms the acid-labile group. For example, tert-butyl esters are suitable.

The polar groups formed from the acid-labile groups can themselves be used as anchor groups for binding the amplification agent. For this purpose, after the development of the exposed resist, the acid-labile groups are cleaved and polar groups are liberated also in the previously unexposed parts of the structured resist. The reaction between the polar group and the amplification agent can lead to the formation of a covalent bond between the anchor group and the amplification agent. However, the amplification agent may also be linked to the anchor group of the polymer via noncovalent bonds, e.g. ionic interactions or dipole-dipole interactions.

In addition to the acid-labile groups, further groups which act as reactive anchor groups during the chemical amplification are preferably present in the polymer of the photoresist. A reactive anchor group is understood as meaning an anchor group which can react with the amplification agent even without further activation. For example, here, prior elimination of the protection of the anchor group is therefore not necessary for the chemical amplification. Suitable reactive anchor groups are, for example, groups which are selected from the group consisting of anhydrides, isocyanates, imides, epoxides, esters, amides, ketenes, oxiranes, sulfonic acids, thiophenols and urethanes. These reactive anchor groups are introduced into the polymer of the photoresist by copolymerization of corresponding monomers that contain at least the reactive anchor group and a polymerizable carbon-carbon double bond.

Particularly suitable anhydride groups are carboxylic anhydrides, in particular groups derived from maleic anhydride, since these systems have readily accessible electrophilic anchor groups which facilitate binding of the nucleophilic amplification agent.

In addition to the monomers, other monomers which are customary for the preparation of polymers for photoresists and, which for example, improve the lithographic properties of the resist or its etch resistance can also be used. The polymers must have adequate film formation properties in order to be able to produce a uniform film of the photoresist on the substrate.

Photo acid generators which may be used are the photo acid generators customary for photoresists. Onium compounds, as described, for example, in Published European Patent application EP 0 955 562 A1, are preferably used.

For example, methoxypropyl acetate, cyclopentanone, cyclohexanone, γ-butyrolactone, ethyl lactate, diethylene glycol dimethyl ether or a mixture of at least two of these compounds may be used as a solvent of the resist (first solvent). In general, however, all conventional solvents or mixtures thereof that are capable of taking up the resist components to give a clear, homogeneous solution having a long shelf-life and that ensure a good layer quality during exposure of the substrate may be used.

The components described can be used in the photoresist in the following ratios:

Film-forming polymer: 1–50% by weight, preferably 2–10% by weight;

Photo acid generator: 0.001–10% by weight, preferably 0.01–1% by weight; and

Solvent: 50–99% by weight, preferably 88–97% by weight.

Further components/additives that influence the resist system advantageously with respect to resolution, film formation properties, shelf life, radiation sensitivity and pot life effect can also be added to the photoresist.

The photoresist is applied to the substrate by conventional methods, for example, by spraying on, spin-coating or a dip process. The solvent is then removed by conventional methods. For this purpose, the substrate with the resist film is generally heated.

Section-by-section exposure of the resist film is then carried out. It is likewise possible to use conventional methods for this purpose. The exposure can be effected, for example, by using a photomask or by direct exposure to focused electrons or ions. Exposure is preferably effected using an exposure radiation having a wavelength in the range from 10 to 400 nm. Particularly preferably, the exposure radiation has a wavelength of less than 200 nm, particularly preferably less than 160 nm. An exposure radiation having a wavelength of 157 nm is particularly suitable. In the exposed parts, an acid is liberated from the photo acid generator, so that a latent image of the desired structure is formed.

The exposure of the resist film is followed by a contrasting step in which the latent image is amplified and is impressed into the polymer of the photoresist so that the photoresist now has a chemical profile. For this purpose, the substrate with the exposed resist film is heated, generally to temperatures of from 80 to 200° C. Under the catalytic influence of the acid, the acid-labile groups on the polymer are eliminated and polar groups are liberated. The contrasted resist film includes nonpolar sections, in which the film-forming polymer is present in its original nonpolar form, and polar sections which contain the polar polymer.

The development step utilizes the different polarity of the polymer in the exposed and unexposed sections, i.e. its different solubility in the aqueous alkaline developer. If the polymer includes acid-labile ester groups in the unexposed state, it includes carboxylic acid groups after exposure and contrasting. The polymer in the unexposed state is therefore comparatively nonpolar and is soluble in comparatively nonpolar or poorly polar solvents. In contrast, after exposure and contrasting, the polymer has a polar character and is therefore insoluble in nonpolar or poorly polar solvents. This difference in the solubility is now utilized in the development step. There, the aqueous alkaline developer is chosen so that the polar polymer is readily soluble therein, whereas the nonpolar film-forming polymer is insoluble therein. Consequently, only the exposed parts of the substrate are removed in the development step, and structures in which the substrate is bare form in the exposed parts.

After development of the exposed and contrasted photoresist, a chemical amplification of the structured resist is carried out according to the invention.

In order to prevent the resist layer from being dissolved by the solvent and hence being lost during the chemical amplification, a solvent in which the unexposed resist, in particular the film-forming polymer, is insoluble or has only very low solubility is chosen as the solvent for the amplification (second solvent). The second solvent therefore has a lower polarity than the first solvent.

As a result of the resist processing steps following the coating, such as exposure and aqueous development, the polarity of the positive-working resist increases further and its solubility in the nonpolar solvent of the amplification agent consequently decreases even further. If the chemical amplification is then carried out from the second solvent, the structures do not suffer any loss of layer thickness and the structures can be fully amplified.

The coordination of the amplification agent to the polymer is preferably effected by formation of a chemical bond between the anchor groups of the polymer and the reactive group of the amplification agent, for example, with the formation of an amide bond. However, salt formation or coordination of polar groups by dipole interactions is also possible. The formation of the amide bond can also be effected by a procedure in which an ammonium salt is first formed by the anchor group and the amplification agent in the development/amplification step and heating is effected in a subsequent production step, for example, during drying the developed and amplified resist. The amide bond is formed between the polymer and the amplification agent with the elimination of water.

The growth in layer thickness can be controlled by the duration of the reaction and the concentration of the amplification agent. In a further embodiment of the inventive process, the growth of the layer thickness of the resist structure that is produced by the incorporation of the amplification agent is regulated using the temperature.

The treatment of the resist structure with the amplification agent is preferably carried out at room temperature and at atmospheric pressure.

Advantageously, the second solvent and/or the third solvent is/are selected from the group consisting of branched acyclic alkanes, straight-chain acyclic alkanes, cyclic alkanes, aromatics and halogenated derivatives thereof and mixtures thereof. These solvents have a low polarity so that the photoresist does not dissolve or swells only to a small extent. Furthermore, these solvents have a low surface tension so that a collapse of structures having a high aspect ratio can be substantially avoided.

Solvents which are selected from the group consisting of heptane, isooctane, decane, undecane, dodecane, mixtures of alkanes, cyclohexane, decahydronaphthalene, toluene, xylene, benzene, chloroform, dichloroethane, perfluorodecalin, silicone oils and a mixture thereof are particularly advantageous for use as the second and/or the third solvent.

It is not necessary for both the second and the third solvent to be strongly nonpolar. According to a further embodiment, the second solvent or the third solvent is an ether, ketone or an alcohol.

The solution for the amplification of the resist structures contains the amplification agent in addition to the second solvent. The amplification agent includes a reactive group that can react with the anchor group on the polymer. The amplification agent is preferably selected from the group consisting of alcohols, amines, sulfonic acids, thiols, carboxylic acids, glycidyl ethers, anhydrides, imides, isocyanates, urethanes, ketenes and epoxides. These compounds contain groups which act as a nucleophile or electrophile and are bonded to the corresponding anchor groups.

Amplification agents that have basic groups as reactive groups are advantageous since they can bind as good nucleophiles to the anchor groups, in particular to carboxylic anhydride groups.

Amino-functionalized organic compounds are particularly suitable as amplification agents. Amino groups have a pronounced nucleophilic character and are therefore particularly suitable for linkage to electrophilic anchor groups.

Particularly preferred amplification agents are compounds which contain an organosilicon, aromatic or aliphatic (preferably cycloaliphatic) partial structure in addition to the reactive groups for linkage to the anchor groups of the polymer and have at least one primary or secondary amino group as reactive groups. The organosilicon partial structure is converted in the oxygen plasma into silicon dioxide and thus provides the desired etch resistance.

Particularly advantageous amplification agents are those which have at least two reactive groups since three-dimensional crosslinking of the resist structure is achieved by using these agents. Crosslinking produced in this manner leads to a stabilization of the resist, which manifests itself, inter alia, in reduced solubility.

Diamines, which at least in some cases have an organosilicon, aromatic or aliphatic structure, are particularly suitable as amplification agents.

Suitable amplification agents are described, for example, in Published European Patent Application EP 0 395 917 B1.

Finally, excess amplification agent is removed. The amplified resist structure can be transferred by dry etching the substrate, for example, in an oxygen or halogen-containing plasma.

In a further embodiment of the process, a solution of medium polarity, such as, for example, isopropanol, can be used as a wash medium.

Further solvents (fourth solvents) may be contained, as additives for influencing the characteristics of the amplification, in the second solvent in which the amplification agents are dissolved.

In order to be able to achieve a sufficient chemical amplification of the resist structure within reaction times that are suitable for industrial use, the amplification agent must be capable of reacting sufficiently rapidly with the anchor groups of the polymer. In order to make it easier for the amplification agent to gain access to the anchor groups, it is advantageous if the resist structure is swollen superficially to a small extent. However, the resist structure must not dissolve in the (second) solvent.

Fourth solvents that have a higher polarity than the second solvent, such as ethers and esters, result in improved swelling of the polymer and thus accelerate the reaction. However, their nucleophilic character is not sufficient for binding to the electrophilic sites of the polymer.

More strongly nucleophilic polar fourth solvents, such as, for example, hexanol, methoxypropanol and water, permit improved swelling of the polymer and thus accelerate the reaction. At the same time, they make their own generally small contribution to the growth in layer thickness by binding to electrophilic anchor groups of the polymer.

These polar fourth solvents are added to the second solvent in very small amounts. If their amount is too large, removal of the resist structure may occur.

Furthermore, compounds that act as catalysts and only have an activating effect on the chemical amplification reactions taking place, without themselves being permanently bound to the polymer, can also be added to the second solvent. Suitable preferred compounds are, for example, sterically hindered bases, such as trioctylamine or tertiary amines, diazabicycloundecene DBU, diazabicyclononene DBN and diazabicyclooctane DABCO. These compounds catalyze, for example, the attack of a nucleophilic group on a carboxylic anhydride group and thus increase the rate at which the chemical amplification takes place.

In the solution for the chemical amplification, the individual components can be used in the following ratios:

Amplification agent: 0.1–50% by weight, preferably 2–10% by weight,

Additives: 0.1–30% by weight, preferably 0.1–10% by weight, and

Solvent: 50–99% by weight, preferably 90–97% by weight.

Additives are understood as meaning, for example, the polar fourth solvents and catalysts described above.

In the inventive process, excess amplification agent is removed by washing with a third solvent that has a lower polarity than the first solvent and in which the film-forming polymer is insoluble. For example, the solvent used for washing may be the same solvent as that in which the chemical amplification was also carried out.

The properties of the wash medium, in particular its polarity, can be modified if the third solvent contains an additive which is selected from the group consisting of ethers, ketones, esters and alcohols.

Other features which are considered as characteristic for the invention are set forth in the appended claims.

Although the invention is illustrated and described herein as embodied in a process for increasing the etch resistance and for reducing the hole and trench width of a photoresist structure using solvent systems of low polarity, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A and 1B are electron micrographs of collapsed resist structures during development with a polar solvent system;

FIG. 2 is a schematic diagram of a resist structure for explaining the collapse of resist structures;

DESCRIPTION OF THE PREFERRED EMBODIMENTS

Figure 3:
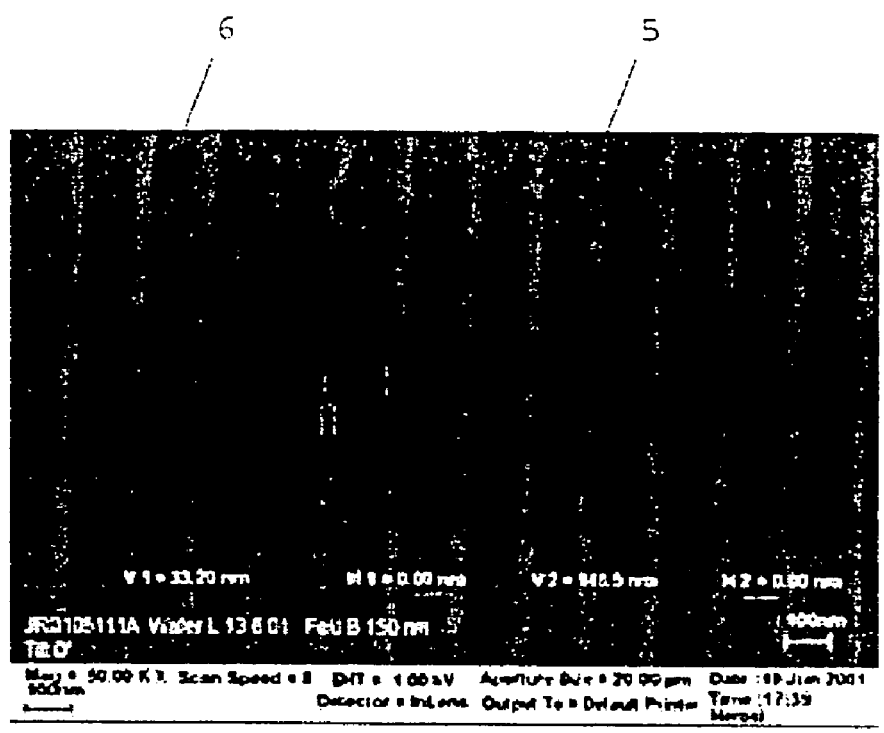
FIG. 3 is an electron micrograph showing a plan view of resist lines of an anhydride-containing resist before the chemical amplification.

Referring now to the figures of the drawing in detail and first, particularly, to FIGS. 1A and 1B thereof, there are shown two examples of structures which were destroyed by the action of capillary forces. The structures shown were developed with an aqueous standard developer so that the trenches are initially still filled with water or with an aqueous solvent. On evaporation of the solvent, the structures deform so that the lands, as shown in FIG. 1A, are no longer arranged perpendicular to the substrate. In extreme cases, the structures may also be torn off, as shown in FIG. 1B.

The forces acting on the structures are shown schematically in FIG. 2. FIG. 2 schematically shows a section of a resist structure. Lands 2 which consist of a resist material are arranged on a substrate 1. The lands 2 have a high aspect ratio AR=H/W. The trenches 3 arranged between the lands are initially still filled with solvent 4. On drying, the solvent evaporates and capillary forces begin to act on the structures 2 depending on the surface tension γ of the solvent. The forces acting on the structures are calculated as $F_{Net}=(\gamma \cos \theta/S)\Delta hD$.

If the shear forces are too high, the structures 2 collapse. A similar phenomenon is also observed during the chemical amplification/silylation. During the chemical amplification, for example, organosilicon compounds (siloxanes) are bound to the resist polymer. The incorporation of siloxanes during the silylation leads on the one hand to partial swelling of the structures present and to the desired modification of the resist structures. On the other hand, the resist structures present soften with increasing reaction time. Completely silylated structures are finally very soft. The danger of a collapse of the structures thus increases with increasing silylation, since the mechanical resistance of the structures to the capillary forces decreases.

EXAMPLE 1

Structuring of the Resist

An anhydride-containing resist consisting of 3% by weight of resist polymer and 0.075% by weight of photo acid generator in methoxypropyl acetate, which contains a polymer that consists of the monomers tert-butyl methacrylate (33 mol %), maleic anhydride (44 mol %) and cyclohexene (22 mol %) and that was precipitated from heptane during its preparation, is applied from methoxypropyl acetate solution to a silicon wafer as the substrate to be structured and is dried in a subsequent first heating step (80–160°C., soft bake). The resulting solid resist film, which has a layer thickness of 50 nm, is exposed by targeted exposure to electromagnetic radiation (157 nm) using a photomask which reproduces a test pattern. The wafer with the exposed resist film is then subjected to a second heating step (postexposure bake (PEB) at about 80–200° C.). Here, the functional protective groups on the polymer are eliminated by the catalytic influence of the acid produced from the exposure. In the exposed parts, the resist film is thus soluble in an alkaline developer.

FIG. 3 shows a plan view of the resist pattern. The light parallel lines 5 correspond to lands of the resist material, while the dark lines correspond to the trenches 6 that are arranged between the lands and in which the substrate is bare. The line width of the lands 5 is 35 nm.

EXAMPLE 2

Chemical Amplification

A solution of an aminosiloxane in heptane is added to the structured resist obtained in example 1, and the solution is left on the resist for 60 seconds. The chemically amplified resist is then washed with heptane and blown dry with nitrogen.

Figure 4:
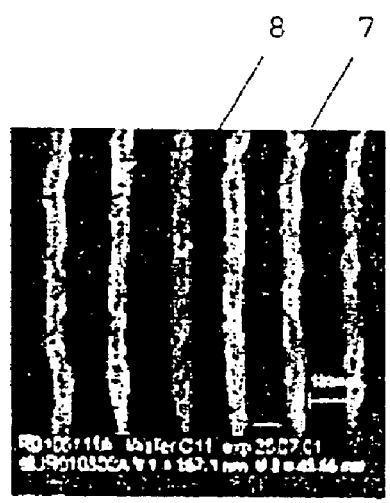
FIG. 4 is an electron micrograph showing a plan view of resist lines of an anhydride-containing resist after the chemical amplification.

FIG. 4 is a plan view of the amplified resist. The light lines 7 once again correspond to the lands, which now have a line width of 45 nm, while the trenches 8 arranged between the lands 7 were narrowed.

We claim:

1. A process for chemically amplifying structured resists, which comprises:

applying a chemically amplified photoresist to a substrate, the photoresist having a film-forming polymer including acid-labile groups for being cleaved under action of an acid and liberating polar groups resulting in an increase in a solubility of the film-forming polymer in aqueous alkaline developers, the film-forming polymer also including anchor groups for linking amplification agents, the photoresist also including a photo acid generator and a first solvent in which the film-forming polymer is soluble;

drying the photoresist to obtain a resist film;

exposing the resist film, section-by-section, such that an exposed resist is obtained and such that the photo acid generator liberates an acid in exposed parts of the resist film;

heating the exposed resist to cleave the acid-labile groups in the exposed parts of the resist and to liberate the polar groups on the film-forming polymer such that nonpolar resist sections and polar resist sections are obtained;

developing the resist with an aqueous alkaline developer to detach the polar resist sections from the substrate and to obtain a structured resist, the aqueous alkaline developer having a higher polarity than the first solvent, and the film-forming polymer being insoluble in the aqueous alkaline developer;

applying an amplification agent to the structured resist, the amplification agent being dissolved in a second solvent having a lower polarity than the first solvent, the film-forming polymer being substantially insoluble in the second solvent, and the amplification agent having at least one reactive group for reacting with at least one of the anchor groups of the film-forming polymer to link the amplification agent to the film-forming polymer; and removing excess amplification agent using a third solvent having a lower polarity than the first solvent, the film-forming polymer being insoluble in the third solvent.

2. The process according to claim 1, wherein the anchor groups of the film-forming polymer are protected anchor groups.

3. The process according to claim 2, which comprises, before performing the step of applying the amplification agent, liberating the at least one anchor group from the protected anchor groups.

4. The process according to claim 1, wherein the second solvent is selected from a group consisting of branched acyclic alkanes, straight-chain acyclic alkanes, cyclic alkanes, aromatics, and halogenated derivatives of the aromatics.

5. The process according to claim 1, wherein the second solvent is a mixture including at least two components selected from a group consisting of branched acyclic alkanes, straight-chain acyclic alkanes, cyclic alkanes, aromatics, and halogenated derivatives of the aromatics.

6. The process according to claim 1, wherein the third solvent is selected from a group consisting of branched acyclic alkanes, straight-chain acyclic alkanes, cyclic alkanes, aromatics, and halogenated derivatives of the aromatics.

7. The process according to claim 1, wherein the third solvent is a mixture including at least two components selected from a group consisting of branched acyclic alkanes, straight-chain acyclic alkanes, cyclic alkanes, aromatics, and halogenated derivatives of the aromatics.

8. The process according to claim 1, wherein the second solvent is selected from a group consisting of an ether, a ketone, and an alcohol.

9. The process according to claim 1, wherein the third solvent is selected from a group consisting of an ether, a ketone, and an alcohol.

10. The process according to claim 1, wherein the second solvent includes a dissolved additive acting as a Lewis base.

11. The process according to claim 10, wherein the additive is an ether or an ester.

12. The process according to claim 10, wherein the additive is an alcohol.

13. The process according to claim 10, wherein the additive is a sterically hindered base.

14. The process according to claim 13, wherein the sterically hindered base is a tertiary amine.

15. The process according to claim 1, wherein the third solvent includes an additive selected from a group consisting of ethers, ketones, esters, and alcohols.

16. The process according to claim 1, wherein the second solvent is selected from the group consisting of heptane, isooctane, decane, undecane, dodecane, mixtures of alkanes, cyclohexane, decahydronaphthalene, toluene, xylene, benzene, chloroform, dichloroethane, perfluorodecalin, silicone oils and a mixture thereof.

17. The process according to claim 16, wherein the second solvent is heptane.

18. The process according to claim 16, wherein the first solvent is selected from the group consisting of methoxypropyl acetate, cyclopentanone, cyclohexanone, γ-butyrolactone, ethyl lactate, diethylene glycol dimethyl ether and mixtures thereof.

19. The process according to claim 1, wherein the first solvent is hexanol.

* * * * *